(12) United States Patent
Gutsche et al.

(10) Patent No.: US 7,316,951 B2
(45) Date of Patent: Jan. 8, 2008

(54) FABRICATION METHOD FOR A TRENCH CAPACITOR HAVING AN INSULATION COLLAR

(75) Inventors: Martin Gutsche, Dorfen (DE); Harald Seidl, Pöring (DE)

(73) Assignee: Infineon Technologies AG, Munich (DE)

( * ) Notice: Subject to any disclaimer, the term of this patent is extended or adjusted under 35 U.S.C. 154(b) by 225 days.

(21) Appl. No.: 11/191,461

(22) Filed: Jul. 28, 2005

(65) Prior Publication Data

US 2006/0035430 A1 Feb. 16, 2006

(30) Foreign Application Priority Data

Aug. 16, 2004 (DE) ...................... 10 2004 039 663

(51) Int. Cl.
*H01L 21/8234* (2006.01)
(52) U.S. Cl. ...................... 438/238; 438/239; 438/242; 438/243; 438/244; 438/248; 438/386; 257/E21.396; 257/E21.651
(58) Field of Classification Search ................ 438/242, 438/248
See application file for complete search history.

(56) References Cited

U.S. PATENT DOCUMENTS 6,100,132 A * 8/2000 Sato et al. .................. 438/243
6,936,512 B2 * 8/2005 Chudzik et al. ............. 438/243
2002/0158281 A1 * 10/2002 Goldbach et al. ........... 257/296
2003/0207532 A1 * 11/2003 Chudzik et al. ............. 438/243

* cited by examiner

Primary Examiner—Michael Lebentritt
Assistant Examiner—Kyoung Lee
(74) Attorney, Agent, or Firm—Jenkins, Wilson, Taylor & Hunt, P.A.

(57) ABSTRACT

The present invention provides a fabrication method for a trench capacitor having an insulation collar (10) in a silicon substrate (1), having the steps of: providing a trench (5) in the silicon substrate (1); providing the insulation collar (10) in the upper trench region as far as the top side of the silicon substrate (1); depositing a layer (12) made of a metal oxide in the trench (5); carrying out a thermal treatment for selectively reducing the layer (12), a region of the layer (12) that lies below the insulation collar (10) above the silicon substrate (1) being reduced and being converted into a first capacitor electrode layer (15) made of a corresponding metal silicide, and a region of the layer (12) that lies above the insulation collar (10) not being reduced; selectively removing the non-reduced region of the layer (12) that lies above the insulation collar (10); providing a capacitor dielectric layer (18) in the trench (5) above the first capacitor electrode layer (15); and providing a second capacitor electrode layer (20) in the trench (5) above the capacitor dielectric layer (18).

8 Claims, 4 Drawing Sheets

FABRICATION METHOD FOR A TRENCH CAPACITOR HAVING AN INSULATION COLLAR

TECHNICAL FIELD

The present invention relates to a fabrication method for a trench capacitor having an insulation collar.

BACKGROUND ART

Although applicable in principle to any desired integrated circuits, the present invention and also the problem area on which it is based are explained with regard to integrated memory circuits in silicon technology.

Although applicable to any desired trench capacitors having an insulation collar, the present invention and also the problem area on which it is based are discussed with reference to a trench capacitor having an insulation collar for use in a semiconductor memory cell.

In trench capacitors, the doped crystalline silicon of the substrate has previously been utilized as a bottom capacitor electrode layer. More recently it has been proposed to use a metallic bottom capacitor electrode layer as a separate layer in the trench. The following integration variants, in particular, are taken into consideration in this context:

a) deposition of a thin metallic capacitor electrode layer in the trench and subsequent patterning by means of lithography/etching, b) salicide process, i.e. deposition of a metallic capacitor electrode layer in the trench, which layer comprises an elementary metal, such as e.g. W, Ti, . . . , and subsequent siliciding. This process can be carried out in a self-aligned manner with respect to the insulation collar made of silicon oxide and is described for example in EP 1 364 373 A1.

What has proved to be problematic in producing a bottom metallic capacitor electrode layer for a trench capacitor is the fact that the bottom metallic capacitor electrode layer must be very thin, on the one hand, in order not to greatly reduce the area of the trench capacitor and, on the other hand, the integration requires conventional lithography and etching processes which complicate the method sequence and which have structural limitations.

SUMMARY OF THE INVENTION

The object of the present invention is to specify an improved fabrication method for a trench capacitor having an insulation collar which has a thin bottom metallic electrode.

According to the invention, this object is achieved by means of the fabrication method specified in claim 1.

The present invention is based on the idea of realizing a self-aligned production of a bottom metallic capacitor electrode layer by firstly providing a metal oxide in the trench, which is reduced by means of a subsequent thermal treatment where it lies above the silicon substrate and is in this case converted into a metal silicide capacitor electrode layer. The process proceeds only in the regions in which the metal oxide is in contact with the substrate silicon. No conversion occurs in the region of the insulation collar or on the surface of the surrounding structure, for which reason the metal oxide can be selectively removed again there later.

The method according to the invention firstly has the advantage that the capacitance is increased on account of the metallic electrode structure. A combination with measures that enlarge the surface area, such as e.g. HSG, mesopore etching, . . . is possible. On account of the absence of lithography/etching processes, the method according to the invention causes only a small additional process complexity with respect to the known process. In this case, the bottom capacitor electrode layer made of metal silicide is formed in a self-aligned manner with respect to the insulation collar. Fabrication of thin and homogeneous metallic layers in the trench is possible, i.e. the method according to the invention is scalable.

Furthermore, a conformal deposition of layers made of metal oxide in trench structures having a high aspect ratio can be realized substantially more simply, for example by means of the ALD method (ALD=atomic layer deposition), than the deposition of elementary metals as described in e.g. EP 1 364 373 A1.

Advantageous developments and improvements of the subject-matter of the invention are found in the subclaims.

In accordance with one preferred development, the metal oxide layer comprises $HfO_2$.

In accordance with a further preferred development, the metal oxide layer comprises a rare earth oxide.

In accordance with a further preferred development, the metal oxide layer comprises one of the following materials: $Ta_2O_5$, $TiO_2$, $ZrO_2$, $CoO$, $Ni_2O_3$, $IrO_2$, $RuO_2$.

In accordance with a further preferred development, the capacitor dielectric layer comprises $Al_2O_3$.

In accordance with a further preferred development, the capacitor dielectric layer comprises a rare earth oxide or $HfO_2$ or mixtures of said oxides with $Al_2O_3$.

In accordance with a further preferred development, the second capacitor electrode layer comprises Si or TiN.

In accordance with a further preferred development, the thermal treatment takes place in the temperature range from 400 to 1100° C. under a hydrogen atmosphere.

In accordance with a further preferred development, the metal oxide layer is deposited by means of the ALD method.

In accordance with a further preferred development, the capacitor dielectric layer is deposited by means of the ALD or CVD method.

In accordance with a further preferred development, the second capacitor electrode layer is deposited by means of the ALD or CVD method.

An exemplary embodiment of the invention is illustrated in the drawings and is explained in more detail in the description below.

DETAILED DESCRIPTION OF THE INVENTION

In the figures, identical reference symbols designate identical or functionally identical constituent parts.

Figure 1A:
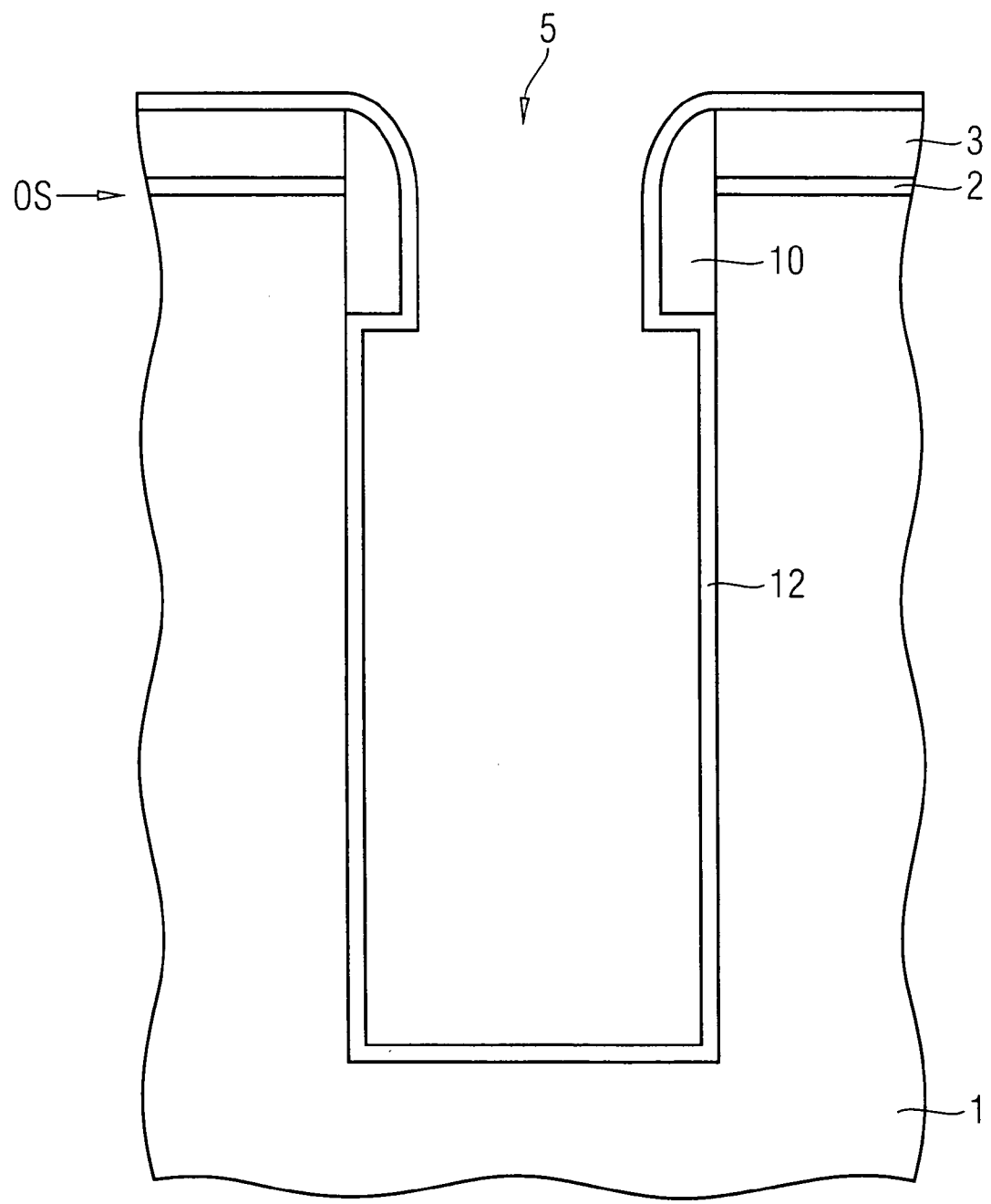
FIGS. 1*a-d* show schematic sectional illustrations of a fabrication method for a trench capacitor having an insulation collar in accordance with one embodiment of the present invention.

In FIG. 1*a*, reference symbol 1 designates a silicon semiconductor substrate, on the top side OS of which a pad oxide layer 2 and a pad nitride layer 3 are provided. An insulation collar 10 made of silicon oxide is provided in the upper region of the trench 5 reaching as far as the top side of the pad nitride layer 3.

Through a conformal deposition of a metal oxide, such as e.g. $HfO_2$, by means of the ALD method (ALD=atomic layer deposition) a layer 12 made of the metal oxide is provided in the trench and on the top side of the surrounding structure, which leads to the process state in accordance with FIG. 1a.

Figure 1B:
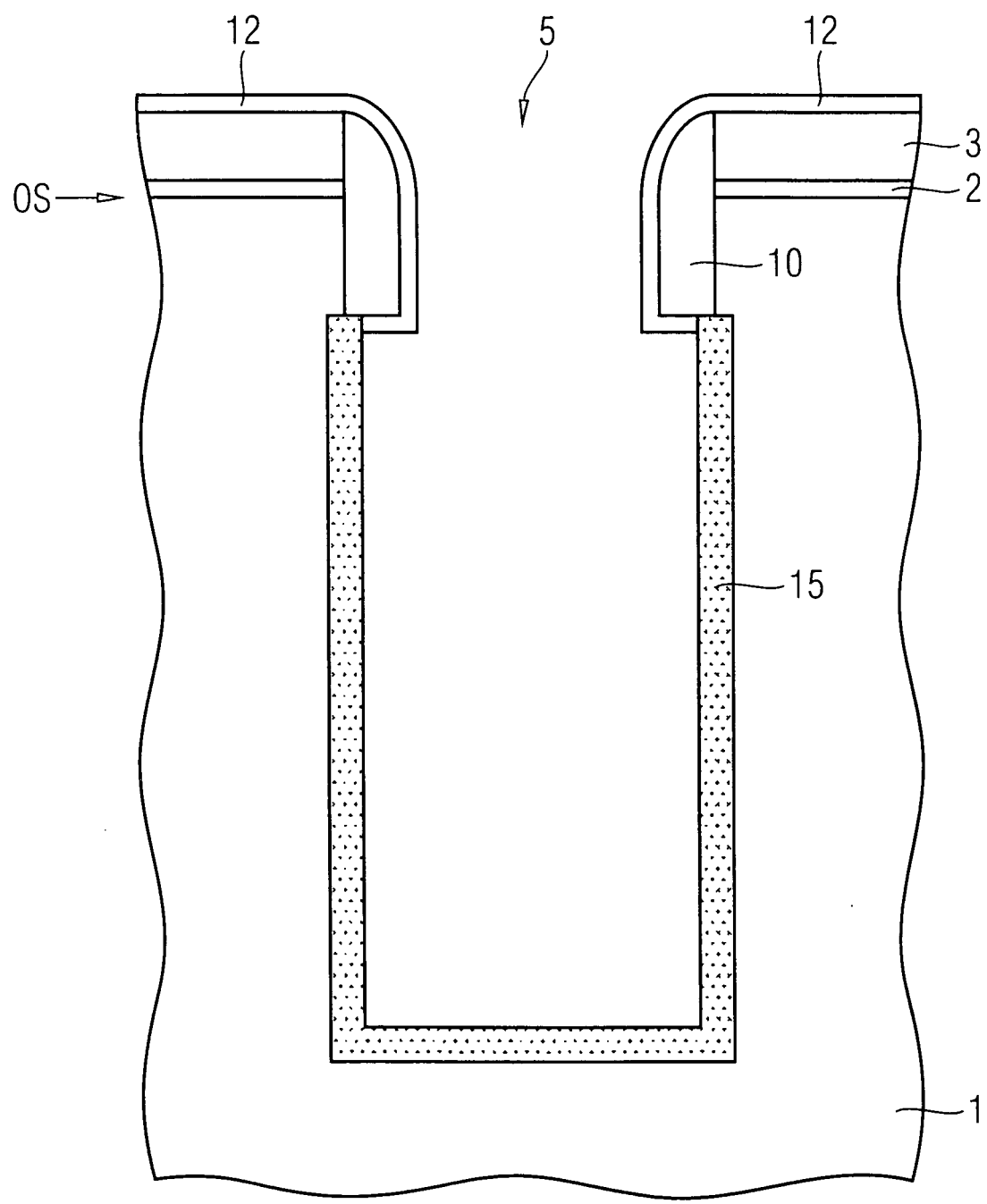

Referring further to FIG. 1b, a thermal treatment is then effected for selectively reducing the layer 12 made of metal oxide at temperatures of between 400° C. and 1100° C. and expediently in an $H_2$ atmosphere. In this case, a region of the layer 12 made of metal oxide which lies below the insulation collar 10 above the silicon substrate 1 is reduced and is converted into a first capacitor electrode layer 15 made of a corresponding metal silicide. A region of the layer 12 made of metal oxide which lies above the insulation collar 10 and the surrounding pad nitride layer 3 is not reduced, by contrast.

Figure 1C:
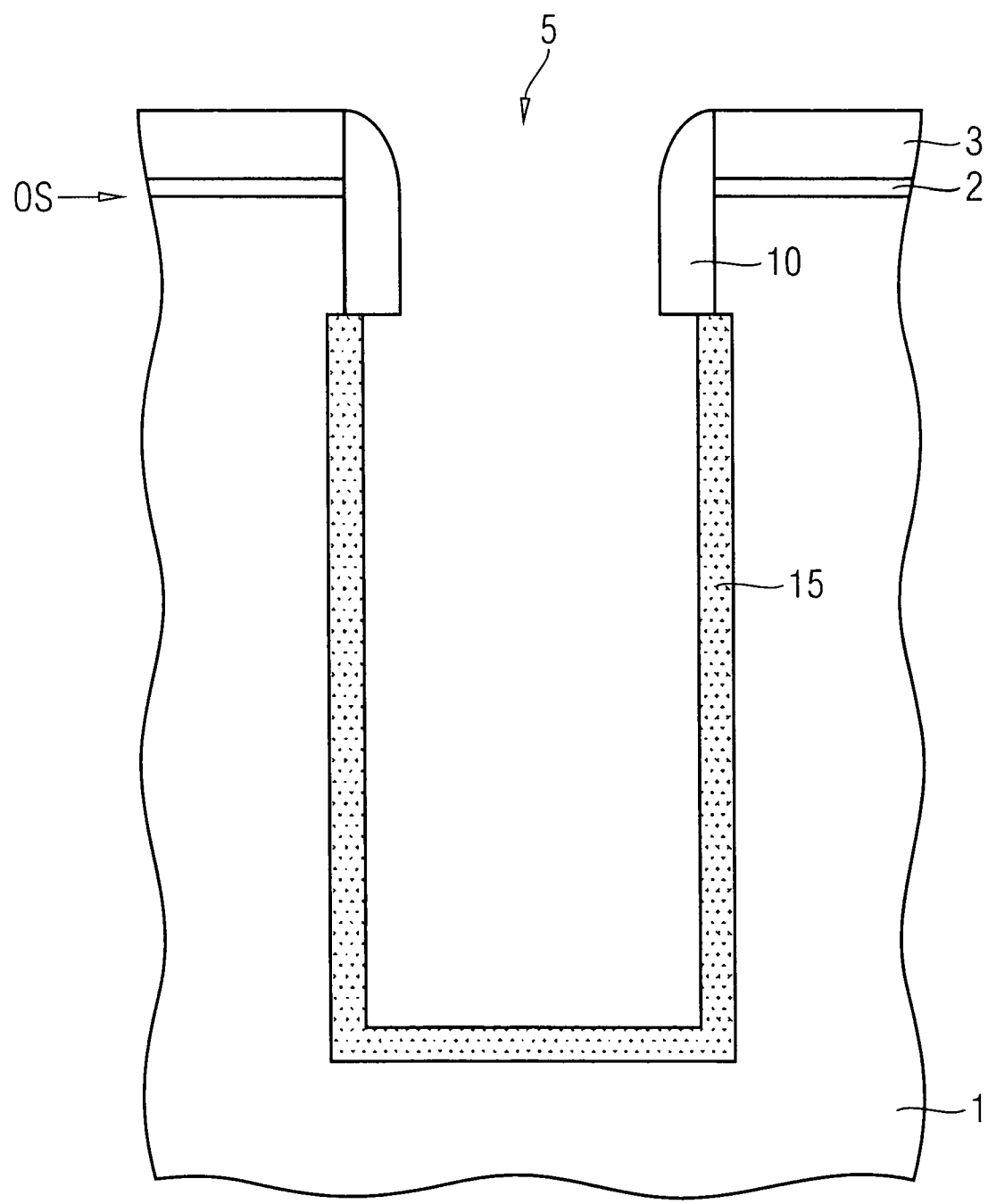

In a subsequent process step illustrated in FIG. 1c, the non-reduced metal oxide, in the regions in which no reaction has taken place, is removed wet-chemically selectively with respect to silicon oxide and silicon nitride.

Figure 1D:
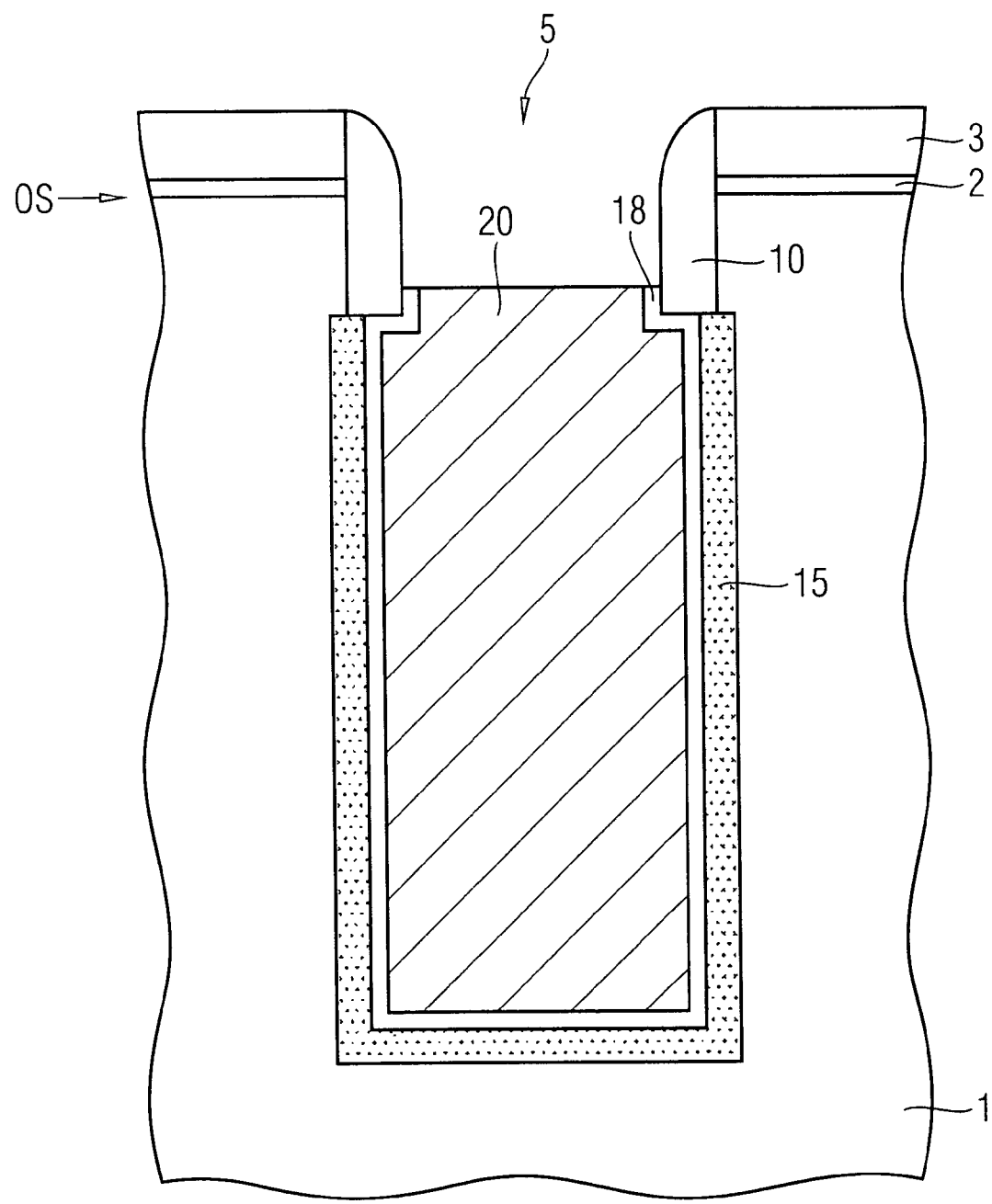

Afterward, in accordance with FIG. 1d, a capacitor dielectric layer 18 is provided above the first capacitor electrode layer 15 in the trench, after which a second capacitor electrode layer 20 is provided in the trench 5 above the capacitor dielectric layer 18.

The capacitor dielectric layer 18 may comprise for example $Al_2O_3$, $HfO_2$, or a similar material, and be deposited by means of the ALD or CVD method. The top capacitor electrode layer 20 may comprise for example silicon or TiN and likewise be provided by means of the ALD or CVD method.

Although the present invention has been described above on the basis of a preferred exemplary embodiment, it is not restricted thereto, but rather can be modified in diverse ways.

In particular, the selection of the layer materials is only by way of example and can be varied in many different ways.

Although for the above embodiment $HfO_2$ or a rare earth oxide is preferred for the layer 12, the following other materials, in particular, are also preferably taken into consideration: $Ta_2O_5 \rightarrow TaSi$, $ZrO_2 \rightarrow ZrSi$, $TiO_2 \rightarrow TiSi$, $CoO \rightarrow CoSi$, $Ni_2O_3 \rightarrow NiSi$, $IrO_2 \rightarrow IrSi$, $RuO_2 \rightarrow RuSi$, and the like.

LIST OF REFERENCE SYMBOLS

1 Si semiconductor substrate
OS Top side of 1
2 Pad oxide
3 Pad nitride
5 Trench
10 Insulation collar
12 Layer made of metal oxide
15 First capacitor electrode layer made of metal silicide
18 Capacitor dielectric layer
20 Second capacitor electrode layer made of metal

What is claimed is:

1. Fabrication method for a trench capacitor having an insulation collar in a silicon substrate, having the steps of:
   (a) providing a trench in the silicon substrate;
   (b) providing the insulation collar in the upper trench region as far as the top side of the silicon substrate;
   (c) depositing a layer made of a metal oxide in the trench, said layer comprising a rare earth oxide;
   (d) carrying out a thermal treatment for selectively reducing the layer, a region of the layer that lies below the insulation collar above the silicon substrate being reduced and being converted into a first capacitor electrode layer made of a corresponding metal silicide, and a region of the layer that lies above the insulation collar not being reduced;
   (e) removing selectively the non-reduced region of the layer that lies above the insulation collar;
   (f) providing a capacitor dielectric layer in the trench above the first capacitor electrode layer; and
   (g) providing a second capacitor electrode layer in the trench above the capacitor dielectric layer.

2. Method according to claim 1, wherein the capacitor dielectric layer comprises $Al_2O_3$.

3. Method according to claim 1, wherein the capacitor dielectric layer comprises a rare earth oxide, $HfO_2$, or a mixture of said oxides with $Al_2O_3$.

4. Method according to claim 1, wherein the second capacitor electrode layer comprises Si or TiN.

5. Method according to claim 1, wherein the thermal treatment takes place in the temperature range from 400 to 1100° C. under a hydrogen atmosphere.

6. Method according to claim 1, wherein the layer is deposited by means of the ALD method.

7. Method according to claim 1, wherein the capacitor dielectric layer is deposited by means of the ALD or CVD method.

8. Method according to claim 1, wherein the second capacitor electrode layer is deposited by means of the ALD or CVD method.

* * * * *